US007966590B2

(12) United States Patent
Kanazawa et al.

(10) Patent No.: US 7,966,590 B2
(45) Date of Patent: Jun. 21, 2011

(54) CIRCUIT DESIGN DATA CONVERSION APPARATUS, CIRCUIT DESIGN DATA CONVERSION METHOD, AND COMPUTER PRODUCT

(75) Inventors: Yuzi Kanazawa, Kawasaki (JP); Takahide Yoshikawa, Kawasaki (JP); Tsuneo Nakata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 500 days.

(21) Appl. No.: 12/076,551

(22) Filed: Mar. 19, 2008

(65) Prior Publication Data
US 2008/0312881 A1    Dec. 18, 2008

(30) Foreign Application Priority Data
Mar. 30, 2007    (JP) .................... 2007-090701

(51) Int. Cl.
*G06F 17/50*    (2006.01)
(52) U.S. Cl. .................... 716/104; 716/101; 716/113

(58) Field of Classification Search .............. 716/101, 716/104, 113
See application file for complete search history.

(56) References Cited

U.S. PATENT DOCUMENTS
6,697,957 B1 * 2/2004 Wang et al. .................... 713/401

FOREIGN PATENT DOCUMENTS
JP    7-249012    9/1995
JP    8-30646    2/1996
* cited by examiner

*Primary Examiner* — Thuan Do
(74) *Attorney, Agent, or Firm* — Fujitsu Patent Center

(57) ABSTRACT

A single module includes a shared combinational circuit, a multiplexed sequential circuit, and a common I/F and is substituted for a multiplexed module formed of plural modules of an identical category and type and including plural CPUs. Specifically, the shared combinational circuit is substituted for n combinational circuits, the multiplexed sequential circuit is substituted for n sequential circuits, and the common I/F is substituted for n input pins and n output pins.

4 Claims, 18 Drawing Sheets

FIG.4

| NAME | SORT | TYPE | MODULE/CELL |
|---|---|---|---|
| module_cpu_a | CPU | ⋮ | CPU |
| module_cpu_b | CPU | ⋮ | CPU |
| ⋮ | ⋮ | ⋮ | ⋮ |
| cell_ff_x | SEQUENTIAL CIRCUIT | ⋮ | D Q |
| cell_ff_y | SEQUENTIAL CIRCUIT | ⋮ | D Q |
| ⋮ | ⋮ | ⋮ | ⋮ |
| cell_ram_z | SEQUENTIAL CIRCUIT | ⋮ | RAM |
| ⋮ | ⋮ | ⋮ | ⋮ |

LIBRARY — 400

CIRCUIT DESIGN DATA CONVERSION APPARATUS, CIRCUIT DESIGN DATA CONVERSION METHOD, AND COMPUTER PRODUCT

CROSS-REFERENCE TO RELATED APPLICATIONS

This application is based upon and claims the benefit of priority from the prior Japanese Patent Application No. 2007-090701, filed on Mar. 30, 2007, the entire contents of which are incorporated herein by reference.

BACKGROUND OF THE INVENTION

1. Field of the Invention

The present invention relates technology of converting design data of a system having identical modules, e.g., CPUs, operating in parallel.

2. Description of the Related Art

In conventional large-scale integration (LSI) design work, simulation is used to verify whether a circuit will operate as desired. In the execution of the simulation using software, the larger the scale of the circuit to be designed, the more time is required for the simulation. Hence, for a large-scale circuit to be designed, a simulation method of mounting the circuit on hardware, such as a field programmable gate array (FPGA), is often employed.

In recent systems that are the subject of design, a multiprocessor configuration for improving speed has become standard. Japanese Patent Application Laid-Open Publication Nos. H7-249012 and H8-030646 disclose conventional techniques for simulating operation of the configuration.

However, while simulation using an FPGA is faster than simulation by software, there is a limitation in the scale of the circuit to be simulated. Particularly, when simulating operation of a system to be designed with multiprocessor-configuration for faster results, a problem may arise in that the circuit becomes too large to be fully mounted on an FPGA due to the plural processor cores being integrated.

For example, in a system to be designed with a multiprocessor-configuration, plural identical CPUs operate communicating through a bus. Conventionally, when simulating a system to be designed made up of n CPUs, circuit volume increases by the number of CPUs. Thus, there has been a problem in that simulations of larger scale circuits to be designed must depend exclusively upon software, causing prolonged design periods.

On the other hand, this problem may be avoided for a large-scale circuit such as a system to be designed with multiprocessor-configuration by using pseudo processors having reduced circuit volumes for processors excluding the actual processor for which operation is to be verified.

However, there is a problem in that omissions might occur during simulation due to operational mismatch with the actual system to be designed, causing reduced design accuracy and consequently, the design period is prolonged as further man-hours are required for preparing pseudo processors.

SUMMARY OF THE INVENTION

It is an object of the present invention to at least solve the above problems in the conventional technologies.

A computer-readable recording medium according to one aspect of the present invention stores therein a design data conversion computer program that causes a computer to execute receiving design data of a design subject, the design subject being a system that includes a multiplexed module formed of a plurality of modules of an identical category and type that operate in parallel and each include a combinational circuit and a sequential circuit; substituting the sequential circuits of the modules with a multiplexed element group formed by multiplexing a group of sequential circuit elements common to each of the sequential circuits; generating a control circuit that time-division operates the multiplexed element group; constructing, based on the design data, a single module that includes one combinational circuit selected from among the combinational circuits of the modules, the multiplexed element group, and the control circuit; and outputting design data of the system including the single module.

A computer-readable recording medium according to another aspect of the present invention stores therein a design data conversion computer program that causes a computer to execute receiving design data of a system to be designed that includes a plurality of multiplexed modules of different types, wherein each of the multiplexed modules is formed of a plurality of modules of an identical category and type that operate in parallel and each include a combinational circuit and a sequential circuit; detecting, based on the design data, a maximum module count among the multiplexed modules; substituting, in each of the multiplexed modules, the sequential circuits of the modules with a multiplexed element group formed by multiplexing a group of sequential circuit elements common to each of the sequential circuits; generating a control circuit that is common to the multiplexed modules and time-division operates the multiplexed element group based on the maximum module count; constructing, based on the design data, a compound module that includes the control circuit and a single module for each of the multiplexed modules, wherein the single module includes the multiplexed element group and one combinational circuit selected from among the combinational circuits of the modules; and outputting design data of the system including the compound module.

A design data conversion apparatus according to still another aspect of the present invention includes a input unit that receives design data of a design subject, the design subject being a system that includes a multiplexed module formed of a plurality of modules of an identical category and type that operate in parallel and each include a combinational circuit and a sequential circuit; a substituting unit that substitutes the sequential circuits of the modules with a multiplexed element group formed by multiplexing a group of sequential circuit elements common to each of the sequential circuits; a generating unit that generates a control circuit that time-division operates the multiplexed element group; a constructing unit that constructs, based on the design data, a single module that includes one combinational circuit selected from among the combinational circuits of the modules, the multiplexed element group, and the control circuit; and an output unit that outputs design data of the system including the single module.

A design data conversion apparatus according to yet another aspect of the present invention includes an input unit that receives design data of a system to be designed that includes a plurality of multiplexed modules of different types, wherein each of the multiplexed modules is formed of a plurality of modules of an identical category and type that operate in parallel and each include a combinational circuit and a sequential circuit; a detecting unit that detects, based on the design data, a maximum module count among the multiplexed modules; a substituting unit that substitutes, in each of the multiplexed modules, the sequential circuits of the modules with a multiplexed element group formed by multiplexing a group of sequential circuit elements common to each of the sequential circuits; a generating unit that generates a control circuit that is common to the multiplexed modules and time-division operates the multiplexed element group based on the maximum module count; a constructing unit that constructs, based on the design data, a compound module that includes the control circuit and a single module for each of the multiplexed modules, wherein the single module includes the multiplexed element group and one combinational circuit selected from among the combinational circuits of the modules; and an output unit that outputs design data of the system including the compound module.

A design data conversion method according to yet another aspect of the present invention includes receiving design data of a design subject, the design subject being a system that includes a multiplexed module formed of a plurality of modules of an identical category and type that operate in parallel and each include a combinational circuit and a sequential circuit; substituting the sequential circuits of the modules with a multiplexed element group formed by multiplexing a group of sequential circuit elements common to each of the sequential circuits; generating a control circuit that time-division operates the multiplexed element group; constructing, based on the design data, a single module that includes one combinational circuit selected from among the combinational circuits of the modules, the multiplexed element group, and the control circuit; and outputting design data of the system including the single module.

A design data conversion method according to still another aspect of the present invention includes receiving design data of a system to be designed that includes a plurality of multiplexed modules of different types, wherein each of the multiplexed modules is formed of a plurality of modules of an identical category and type that operate in parallel and each include a combinational circuit and a sequential circuit; detecting, based on the design data, a maximum module count among the multiplexed modules; substituting, in each of the multiplexed modules, the sequential circuits of the modules with a multiplexed element group formed by multiplexing a group of sequential circuit elements common to each of the sequential circuits; generating a control circuit that is common to the multiplexed modules and time-division operates the multiplexed element group based on the maximum module count; constructing, based on the design data, a compound module that includes the control circuit and a single module for each of the multiplexed modules, wherein the single module includes the multiplexed element group and one combinational circuit selected from among the combinational circuits of the modules; and outputting design data of the system including the compound module.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 4 is a schematic of contents of a library employed by the design data conversion apparatus;

DETAILED DESCRIPTION OF THE PREFERRED EMBODIMENTS

Referring to the accompanying drawings, exemplary embodiments according to the present invention are explained in detail below.

Figure 1:
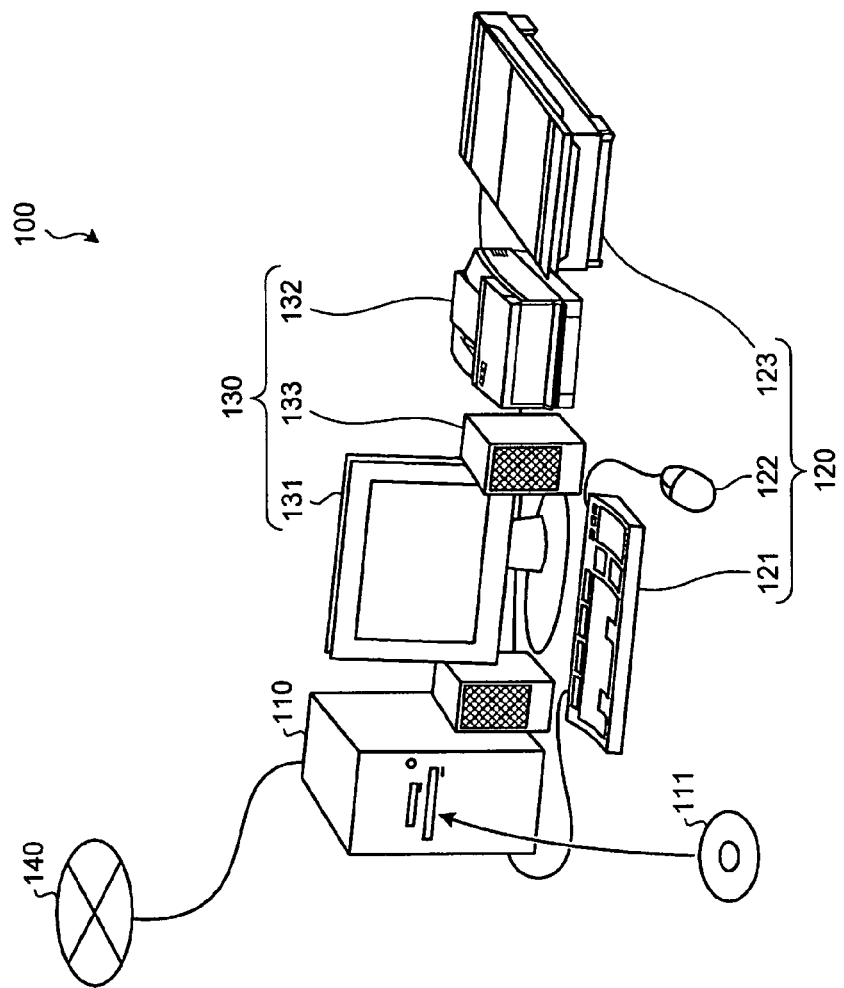
FIG. 1 is a block diagram of a design-data conversion apparatus according to a first embodiment of the present invention.

FIG. 1 is a block diagram of a design data conversion apparatus according to the first embodiment of the present invention. As shown in FIG. 1, a design data conversion apparatus 100 includes a computer 110, an input device 120, and an output device 130, and can be connected with a network 140, e.g., an LAN, a WAN, or the Internet through a non-depicted router or a modem.

The computer 110 has a CPU, a memory, and an interface. The CPU controls the entire design data conversion apparatus 100. The memory is formed of, for example, read-only memory (ROM), a random access memory (RAM), a hard disk (HD), an optical disk 111, or a flash memory. The memory is used as a work area for the CPU.

Various programs are stored in the memory and loaded in response to a command from the CPU. The reading/writing data from/into the HD and the optical disk 111 is controlled by a disk drive. The optical disk 111 and the flash memory are removable. The interface controls input from the input device 120, output to the output device 130, and transmission/reception with respect to the network 140.

As the input device 120, a keyboard 121, a mouse 122, and a scanner 123 are adopted. The keyboard 121 includes keys to input, for example, characters, numeric figures, and various kinds of instructions, and data is input through the keyboard 121. The keyboard 121 may be a touch panel type. The mouse 122 is used to move a cursor, select a range, move a window, or change a window size. The scanner 123 optically reads an image as image data, which is stored in the memory of the computer 110. The scanner 123 may have an optical character recognition (OCR) function.

As the output device 130, a display 131, a printer 132, a speaker 133, and others are adopted. The display 131 displays a cursor, an icon, or a tool box as well as data, such as text, an image, and function information. The printer 132 prints image data or text data. The speaker 133 outputs sound, e.g., a sound effect or a text-to-voice converted sound.

An example of a system 200 that is to be designed according to a first embodiment of the present invention is described. The system 200 includes plural modules (CPU, memory, DMAC, etc.) of an identical category and type.

The plural modules forming a singular module are referred to as a multiplexed module according to the first embodiment. The first embodiment hereinafter describes an example of a multiprocessor system mounted with multiprocessors as the multiplexed module in which plural CPUs of an identical category and type operate in parallel.

Figure 2:
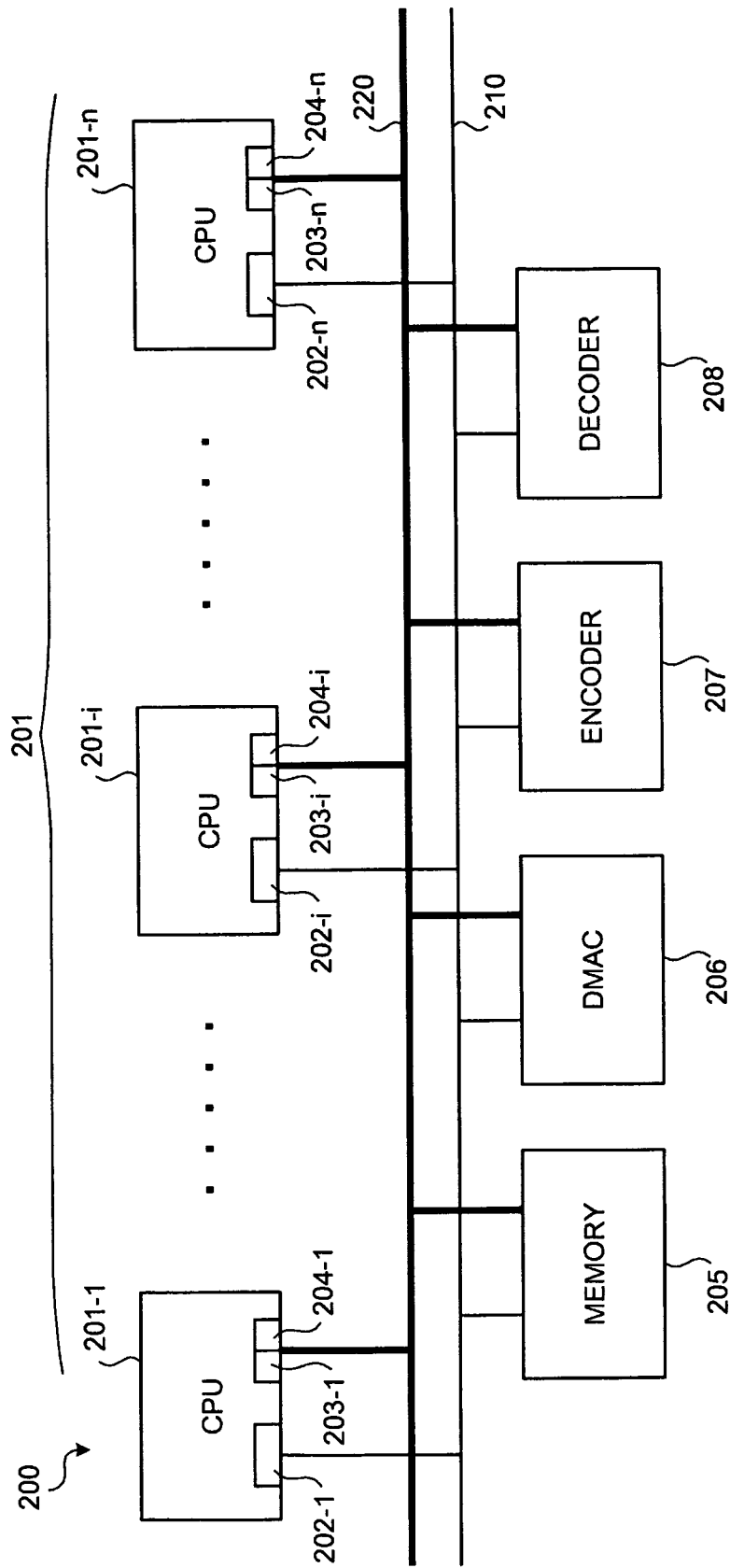
FIG. 2 is a schematic of an example of a system to be designed.

FIG. 2 is a schematic of an example of the system 200. As shown in FIG. 2, a multiprocessor system is mounted with a multiplexed module 201 including n (n=1, 2, . . . ) CPUs 201-1, . . . , 201-$i$, . . . , 201-$n$ as the system 200.

A CPU 201-$i$ is equipped with a clock terminal 202-$i$ connected to a clock line 210 and with an input pin I/F 203-$i$ and an output pin 204-$i$ that are connected to a bus 220. For example, various modules such as a memory 205, a direct memory access controller (DMAC) 206, an encoder 207, and a decoder 208 are connected to the system 200 through the bus 220.

Figure 3:
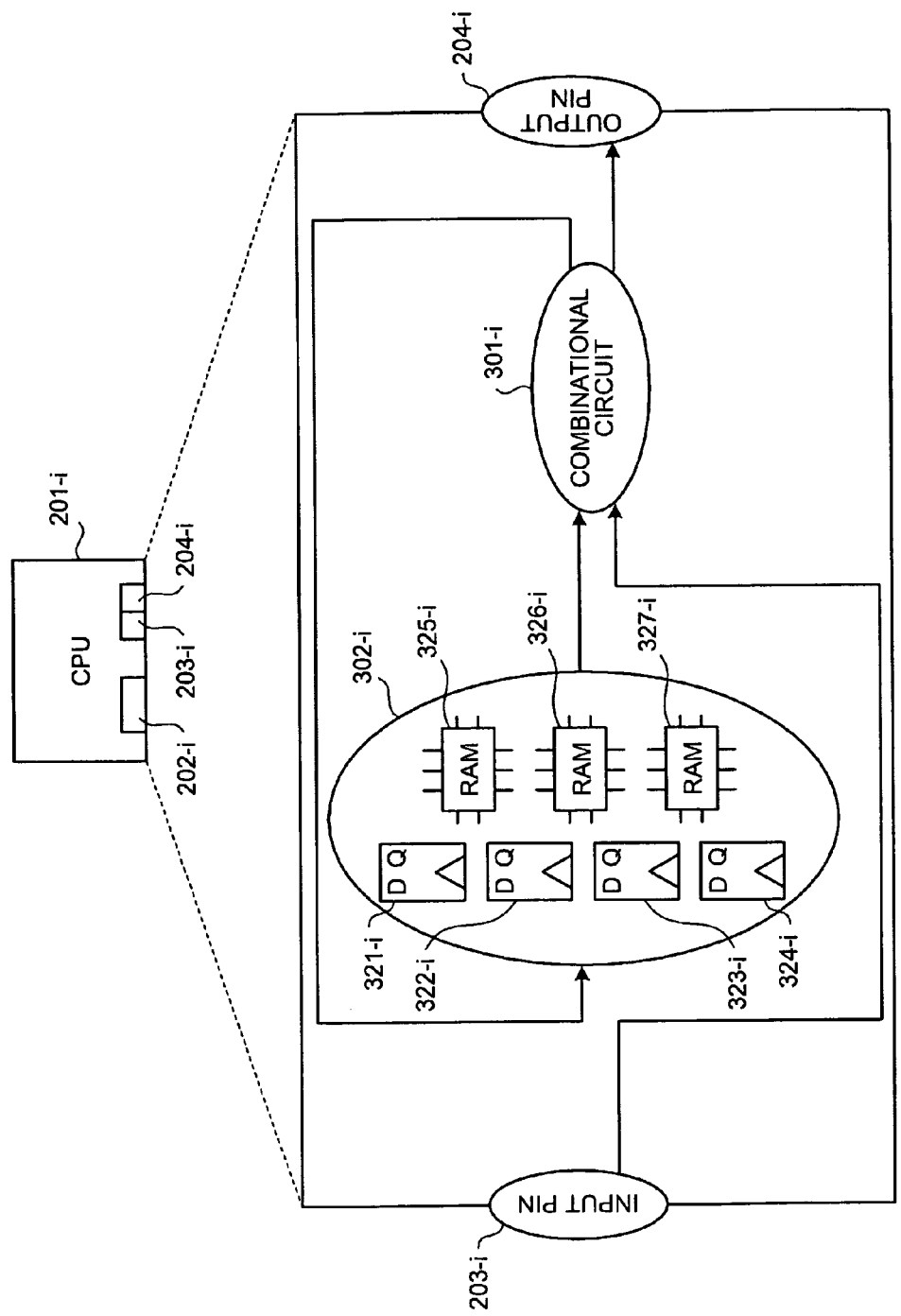
FIG. 3 is a schematic of an internal circuit configuration of an arbitrary CPU making up the multiplexed module of FIG. 2.

FIG. 3 is a schematic of an internal circuit configuration of an arbitrary CPU 201-$i$ making up the multiplexed module 201 of FIG. 2. As shown in FIG. 3, the CPU 201-$i$ includes a combinational circuit 301-$i$, a sequential circuit 302-$i$, the input pin 203-$i$, and the output pin 204-$i$.

The combinational circuit 301-$i$ acquires data from the input pin 203-$i$ or the sequential circuit 302-$i$ and outputs the data to the sequential circuit 302-$i$ or the output pin 204-$i$. The combinational circuit 301-$i$ has the same configuration as combinational circuits 301-1 to 301-($i$−1) and 301-($i$+1) to 301-$n$ of other CPUs 201-1 to 201-($i$−1) and 201-($i$+1) to 201-$n$, respectively. The combinational circuit 301-$i$ is a circuit equivalent to, for example, a sequencer of the CPU 201-$i$.

The sequential circuit 302-$i$ is made up of an enormous number of sequential circuit elements that are connected, such as flip-flops (FF) and RAM. For simplicity, the schematic of FIG. 3 illustrates sequential circuit elements such as FF 321-$i$ to 324-$i$ and RAM 325-$i$ to 327-$i$. Although the sequential circuit 302-$i$ has the same configuration as the sequential circuits 302-1 to 302-($i$−1) and 302-($i$+1) to 302-$n$ of other CPUs 201-1 to 201-($i$−1) and 201-($i$+1) to 201-$n$, a different value is retained by each CPU 210-$i$. The sequential circuit 302-$i$ is comparable to a register of the CPU 201-$i$.

The input pin 203-$i$ acquires data from the bus 220 and outputs the data to the combinational circuit 301-$i$. The output pin 204-$i$ outputs data acquired from the combinational circuit 301-$i$ to the bus 220.

FIG. 4 is a schematic of the contents of a library employed by the design data conversion apparatus 100. FIG. 4 illustrates various circuit data (modules and cells), categorized by name, category, and type, stored in a library 400. The name uniquely specifies modules and cells and corresponds to, for example, an actual product name or a model number. The category represents a category (CPU, sequential circuit, etc.) to which a module/cell belongs.

The type is categorized within a category. For example, within the category of CPU, the CPUs are categorized according to type based on, for example, manufacturer and/or clock frequency. Within the category of sequential circuit, different types thereof are categorized, such as FF and RAM.

More specifically, if the categories of two modules within the system 200 are different, e.g., CPU and FF, the modules are not recognized as being identical. In the same manner, "module_cpu_a" and "module_cpu_b" within the same category of CPU are not recognized as being identical if the CPUs are of different types. The CPUs 201-1 to 201-$n$ of the system 200 shown in FIG. 2 are modules of an identical category and an identical type, e.g., "module_cpu_a".

The library 400 is realized by a recording medium such as a ROM, a RAM, and an HD. The library 400 may be mounted either on the design data conversion apparatus 100 or on an external server communicable via a network.

Figure 5:
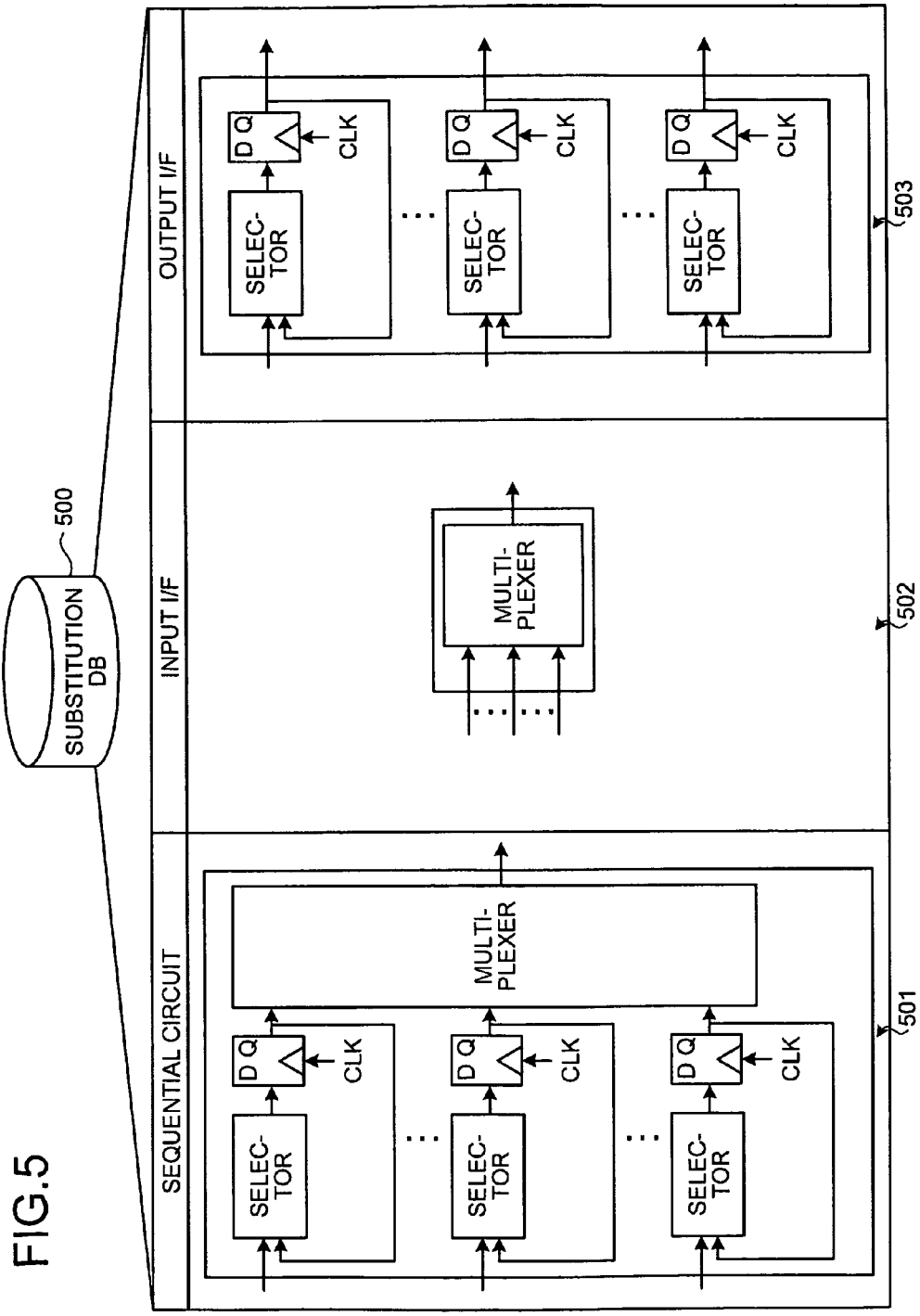
FIG. 5 is a schematic of contents of a substitution DB employed by the design data conversion apparatus.

FIG. 5 is a schematic of the contents of a substitution DB employed by the design data conversion apparatus 100. As shown in FIG. 5, a substitution DB 500 stores substitution modules 501 to 503 for a sequential circuit, an input I/F, and an output I/F. The substitution modules 501 to 503 are expressed by text data in hardware description language (HDL).

The substitution module 501 is a multiplexed circuit in which, for the sequential circuits 302-1 to 302-$n$ included in each of the CPUs 201-1 to 201-$n$, groups of common sequential circuit elements (e.g., FF 321-1 to 321-$n$) included in each of the sequential circuits 302-1 to 302-$n$ are multiplexed. The same is true for other groups of common sequential circuit elements (FF 322-1 to 322-$n$), . . . , (FF 324-1 to 324-$n$).

In addition to the group of common sequential circuit elements having an identical category (FF group, RAM group), the connecting positions are also the same. Although FIG. 5 illustrates only a multiplexed circuit of a sequential circuit element group (FF 321-1 to 321-$n$), . . . , (FF 324-1 to 324-$n$), a multiplexed circuit (not shown) of a sequential circuit element group (RAM 325-1 to 325-$n$), (RAM 327-1 to 327-$n$) is also stored.

The substitution module 501 expressing a multiplexed circuit must satisfy a condition that output data from a sequential circuit element (e.g., FF 321-$i$) of the CPU 201-$i$ is output from the output pin 204-$i$ in an arbitrary state i regardless of the circuit configuration thereof.

Thus by substituting the substitution module 501 for a group of common sequential circuit elements (e.g., FF 321-1 to 321-$n$), members of the group of common sequential circuit elements dispersed among the CPUs 201-1 to 201-$n$ may be multiplexed by a single multiplexed circuit.

The substitution module 502 is an n-input/one-output type input I/F that selectively acquires data input to the CPUs 201-1 to 201-$n$. Thus, by substituting the substitution module 502, the common input pins dispersed among the CPUs 201-1 to 201-$n$ may be multiplexed by a single input I/F.

The substitution module 503 is an output I/F that selectively outputs data output from the combinational circuit 301-1 to 301-$n$ of each of the CPUs 201-1 to 201-$n$. Thus, by substituting the substitution module 503, the common output pins dispersed among the CPUs 201-1 to 201-$n$ may be multiplexed by a single output I/F.

The substitution DB 500 is realized by a recording medium such as a ROM, a RAM, and an HD. The substitution DB 500 may be mounted either on the design data conversion apparatus 100 or on an external server communicable via a network.

Figure 6:
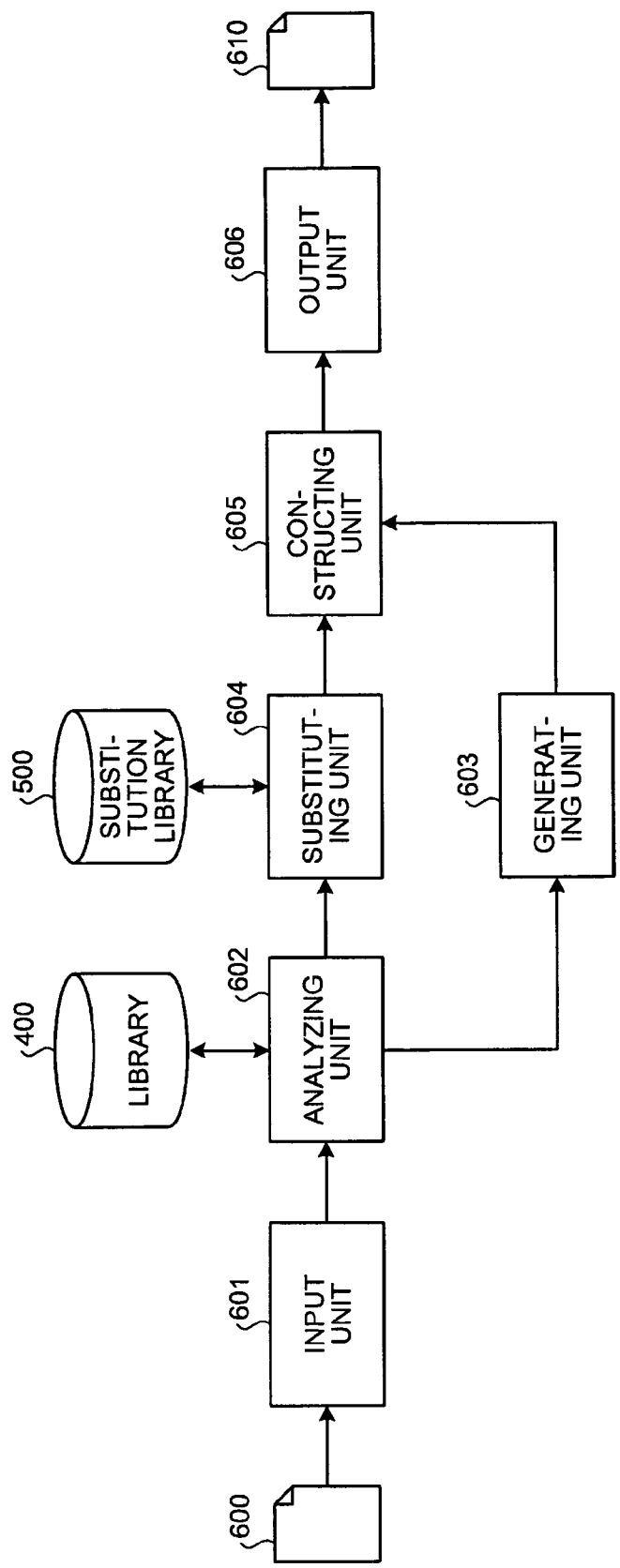
FIG. 6 is a functional diagram of the design data conversion apparatus.

FIG. 6 is a functional diagram of the design data conversion apparatus 100. As shown in FIG. 6, the design data conversion apparatus 100 includes an input unit 601, an analyzing unit 602, a generating unit 603, a substituting unit 604, a constructing unit 605, and an output unit 606. Each of the respective functions of the corresponding units 601 to 606 may be realized by using a processor of the design data conversion apparatus 100 to execute relevant programs stored in a memory of the design data conversion apparatus 100, or by an input/output I/F.

Output data from each of the units 601 to 606 are stored in a memory. Corresponding to the connection destinations, indicated by the arrows in FIG. 6, the output data of the connection sources is read from the memory, and a corresponding program is executed using the processor of the design data conversion apparatus 100.

The input unit 601 receives design data 600 of the system 200. The design data 600 is, for example, a post-logic-synthesis netlist of the system 200. In the netlist, relational connections of the CPU 201-$i$ and internal cells (FF and RAM) making up the system 200 are described using the internal cell names.

The analyzing unit 602 analyses the design data 600 received by the input unit 601. More specifically, the analyzing unit 602 specifies connection relationships of the system 200, the category and type of a module, internal connection relationships of the module, the category and type of a combinational circuit and a sequential circuit, an input pin, and an output pin based on the names described in the netlist with reference to the library 400 shown in FIG. 4. The number of modules of an identical category and type is also specified.

The analyzing unit 602 also specifies combinational circuits common to each CPU 201-$i$ based on the names described in the netlist for sharing of the combinational circuits.

Figure 7:
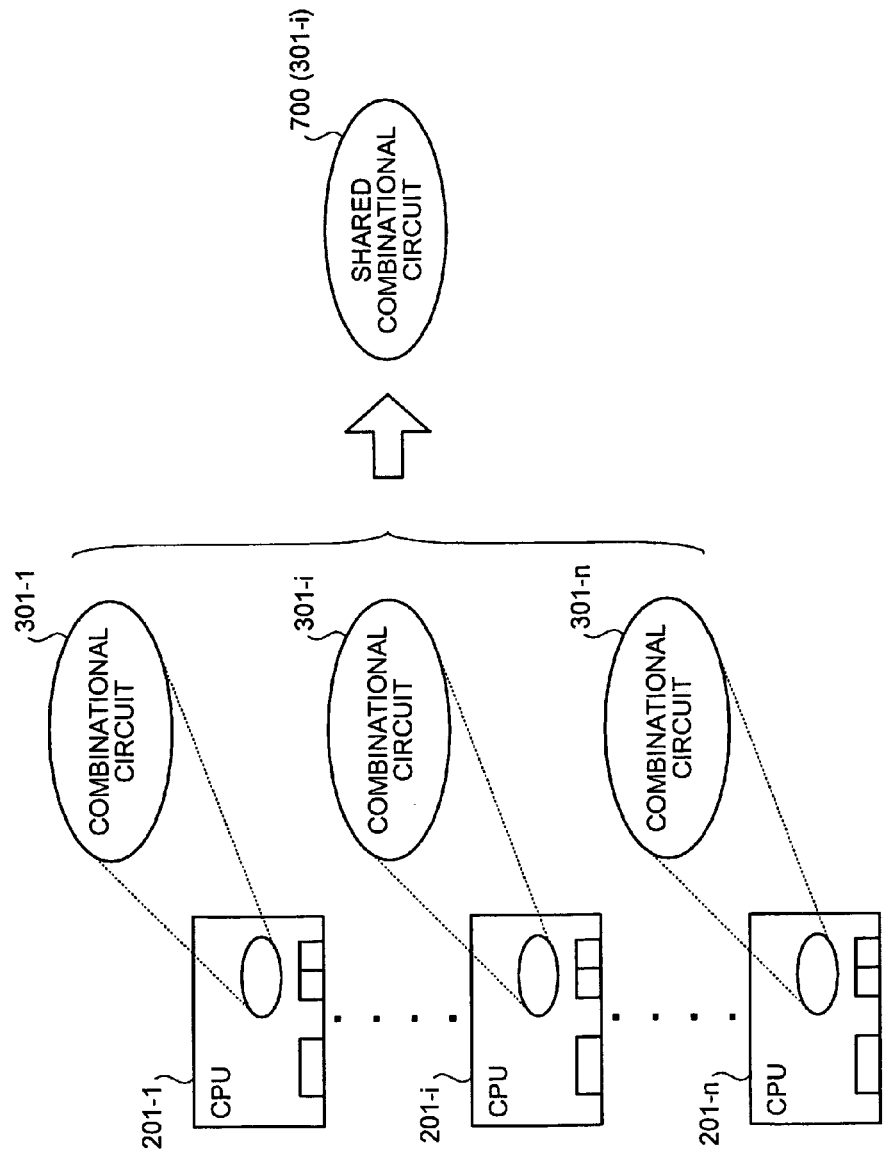
FIG. 7 is a schematic of combinational circuit sharing.

FIG. 7 is a schematic of combinational circuit sharing. As shown in FIG. 7, since combinational circuits 301-1 to 301-$n$ are common components among the CPUs 201-1 to 201-$n$, any one combinational circuit 301-$i$ may be shared. Hereinafter, any one combinational circuit 301-$i$ shared will be described as a shared combinational circuit 700.

The shared combinational circuit 700 may be realized by copying HDL text data of the combinational circuit 301-$i$. Thus, the volume of circuit data of the combinational circuit for simulation may be reduced to 1/n.

The generating unit 603 generates a control circuit based on an analysis result by the analyzing unit 602. The control circuit is for time-division-operation of a module that is an output result from the design data conversion apparatus 100 or of the system 200. The control circuit includes, for example, an incrementing counter.

If the control circuit includes an increment counter, the generating unit 603 determines the count number by detecting the number of CPUs 201-$i$ of an identical category and type from the analyzing unit 602. Specifically, assuming that number of the CPUs 201-$i$ is n, a control circuit is generated such that the count value is incremented at the arrival of each clock up to n+1, where the initial count value is one and the counter is reset to one when count value reaches n+1. Arrival timing of a clock to a counter is simultaneous with the clock arrival timing to other FFs. Output signal of count value i from the counter is denoted as C(i).

For clock count values from 1 to n, a group of common sequential circuit elements (e.g., FF 321-1 to 321-$n$) is time-division-operated, and for a clock count value of n+1, a common I/F is operated. The common I/F is described hereinafter.

The substituting unit 604 substitutes the substitution modules 501 to 503 for the sequential circuit 302-$i$, the input pin 203-$i$, and the output pin 204-$i$ that are analyzed/specified by the analyzing unit 602.

Figure 8:
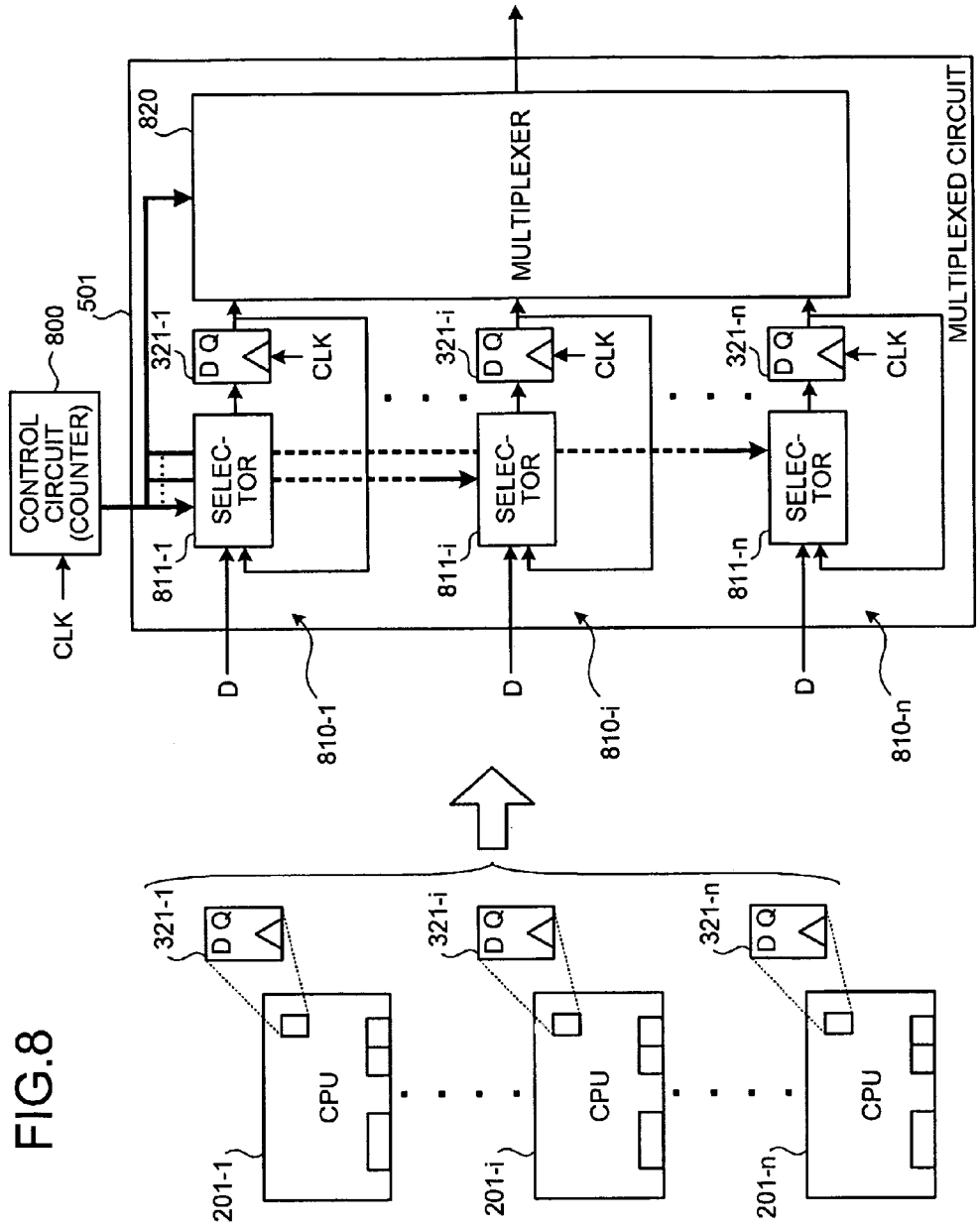
FIG. 8 is a schematic of a substitution example of the sequential circuit.

FIG. 8 is a schematic of a substitution example of the sequential circuit 302-$i$. FIG. 8 illustrates an example in which the substitution module 501 is substituted for the sequential circuit element group (n FFs 321-1 to 321-$n$) common to each of the sequential circuits 302-1 to 302-$n$ of n CPUs 201-1 to 201-$n$ of an identical category and type.

The substitution module 501 includes n circuit blocks 810-1 to 810-$n$ and a multiplexer 820 that selectively outputs output data from any one circuit block 820-$i$ to the shared combinational circuit 700. The substitution module 501 is connected to the control circuit 800. A circuit block 810-$i$ is configured with a selector 811-$i$ and the FF 321-$i$ directly connected each other, and output data from the FF 321-$i$ is feedback-input to the selector 811-$i$.

The FF 321-$i$ outputs a stored data Q to the multiplexer 820 when the count value is i. The selector 811-$i$ receives output data from the shared combinational circuit 700 and the FF 321-$i$, and acquires and outputs a data D to the FF 321-$i$ when the count value is i.

For other count values, the selector 811-$i$ outputs the data Q that is feedback-input. Thus, the FF 321-$i$ is ensured to consistently maintain an FF value corresponding to the CPU 201-$i$. The multiplexer 820, when acquiring a count signal C(i), outputs the data Q from the circuit block 810-$i$ that is selected from among the circuit blocks 810-1 to 810-$n$, to the shared combinational circuit 700.

In the case that substitution is done using Verilog, the substitution process may be carried out by simple text processing by substituting DUMMY FF (CLK, D, Q, and counter) for HDL description of FF (CLK, D, and Q) that is subject to substitution.

Figure 9:
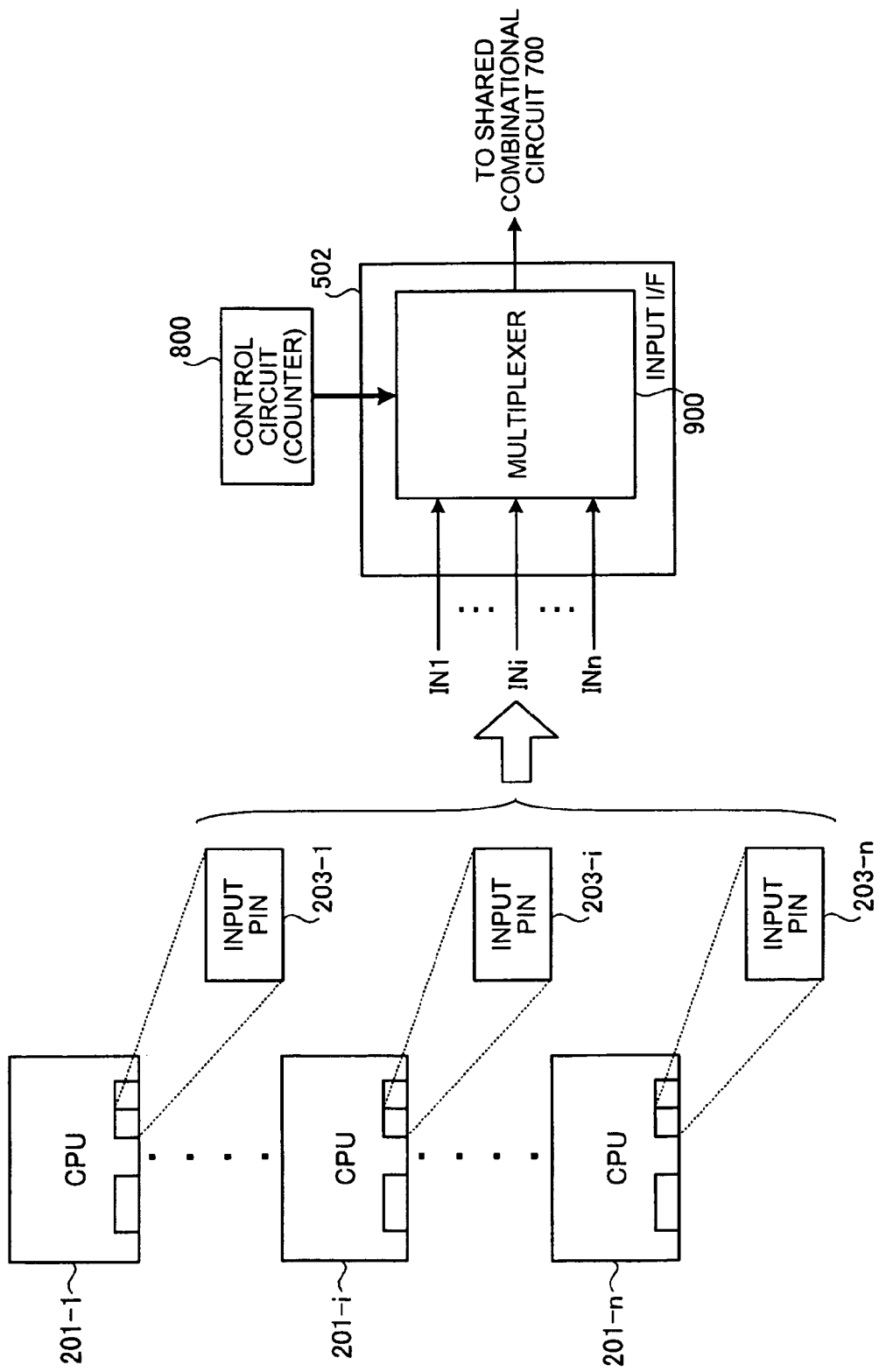
FIG. 9 is a schematic of a substitution example of the input pin.

FIG. 9 is a schematic of a substitution example of the input pin 203-$i$. FIG. 9 shows an example in which the substitution module 502 is substituted for each of the input pins 203-1 to 203-$n$ of n CPUs 201-1 to 201-$n$ of an identical category and type.

The substitution module 502 includes an n-input/one-output type multiplexer 900. The multiplexer 900 is connected to the control circuit 800, and, when acquiring a count signal C(i), outputs input data INi of the CPU 201-I to the shared combinational circuit 700. The input data INi is selected from among input data IN1 to INn of the CPUs 201-1 to 201-$n$.

Figure 10:
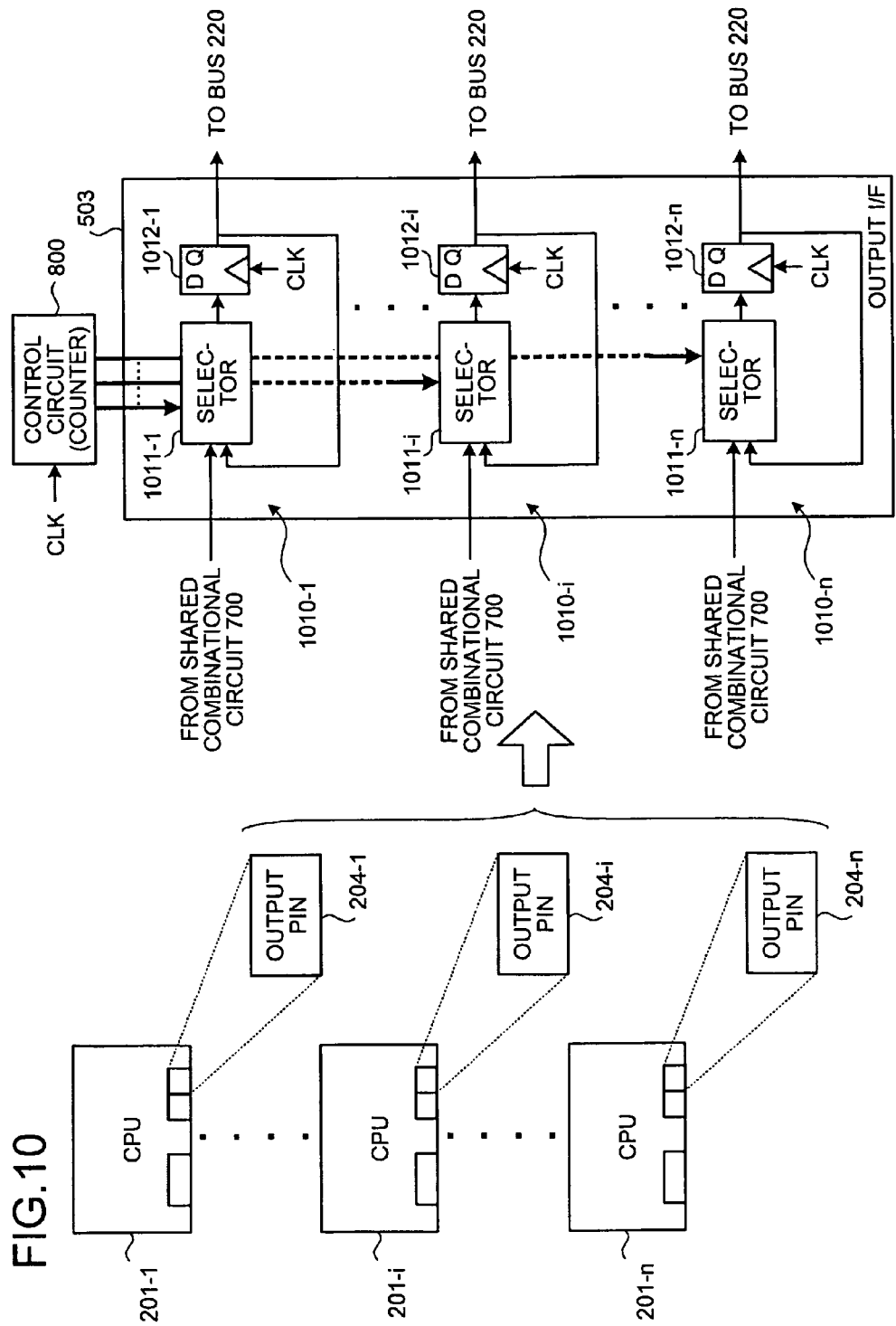
FIG. 10 is a schematic of a substitution example of the output pin.

FIG. 10 is a schematic of a substitution example of the output pin 204-$i$. FIG. 10 illustrates an example in which the substitution module 503 is substituted for each of the output pins 204-1 to 204-$n$ of n CPUs 201-1 to 201-$n$ of an identical category and type.

The substitution module 503 includes n circuit blocks 1010-1 to 1010-$n$. The circuit blocks 1010-1 to 1010-$n$ are connected to the control circuit 800 and acquire a count signal C(i). A circuit block 1010-$i$ is configured with a selector 1011-$i$ and an FF 1012-$i$ that are directly connected, and data output from the FF 1012-$i$ is feedback-input to the selector 1011-$i$.

In the case that a signal transmitted from the CPU 201-$i$ reaches another CPU 201-$j$ through a bus within one clock, additional processing is required for computing a value of an output pin. Specifically, assuming that the value of the counter is incremented up to 2n+2, the state of a combinational circuit of the CPU 201-$i$ is simulated when the value of the counter is n+1+i, and a value of the output pin obtained is stored in the FF 1012-$i$. Hence, the correct value is input even in the case that a signal reaches within one cycle since a value of an output pin of a subsequent cycle has been computed when the counter is 1 to n. As the case that a signal reaches another CPU 201-$j$ within one clock is generally rare, the substitution example is described omitting such a signal.

The FF 1012-*i* outputs the stored data Q to the bus 220 when a count value is i. The selector 1011-*i* receives the output data D and Q respectively from the shared combinational circuit 700 and the FF 1012*i*, and acquires and outputs data D to the FF 1012-*i* when a count value is i. For other count values, data Q that is feedback-input is output.

Figure 11A:
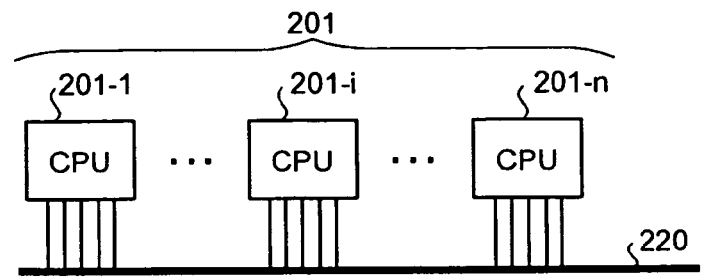
FIGS. 11A to 11C illustrate a typical I/F conversion process.
Figure 11B:
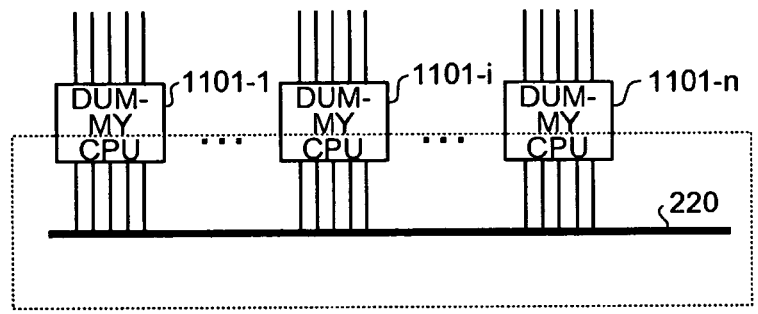
Figure 11C:
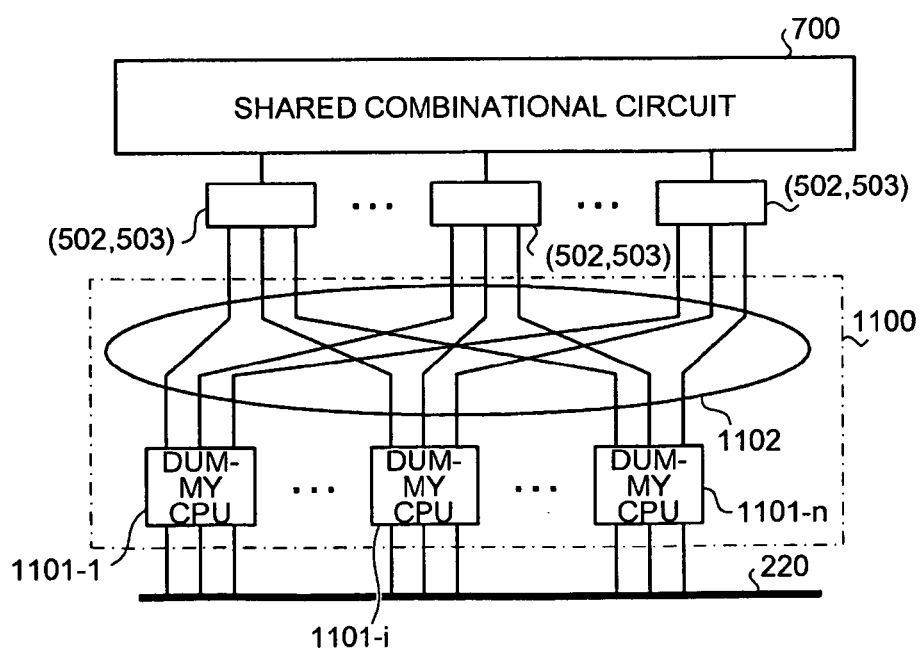

In the case that substitution is done using Verilog, the substitution may be executed by simple replacements and additions by using a stub module. FIGS. 11A to 11C illustrates a typical I/F conversion process. Dummy CPUs 1101-1 to 1101-*n* of FIG. 11B are created by copying the CPUs 201-1 to 201-*n* of FIG. 11A. Since connection relationships between the dummy CPUs 1101-1 to 1101-*n* and the bus 220 (region enclosed by dotted line) do not differ from those between the CPUs 201-1 to 201-*n* and the bus 220, an existing netlist may be applied without modification.

As shown in FIG. 11C, a common I/F 1100 may be established by connecting I/F circuit 1102 between the dummy CPUs 1101-1 to 1101-*n* and each of the substituted input/output pins (substitution modules 502 and 503) of the shared combinational circuit 700. Thus, input/output signals of each pre-multiplex CPU 201-*i* pass through the dummy CPU 1101-*i* and the substitution process is simply implemented.

Figure 12:
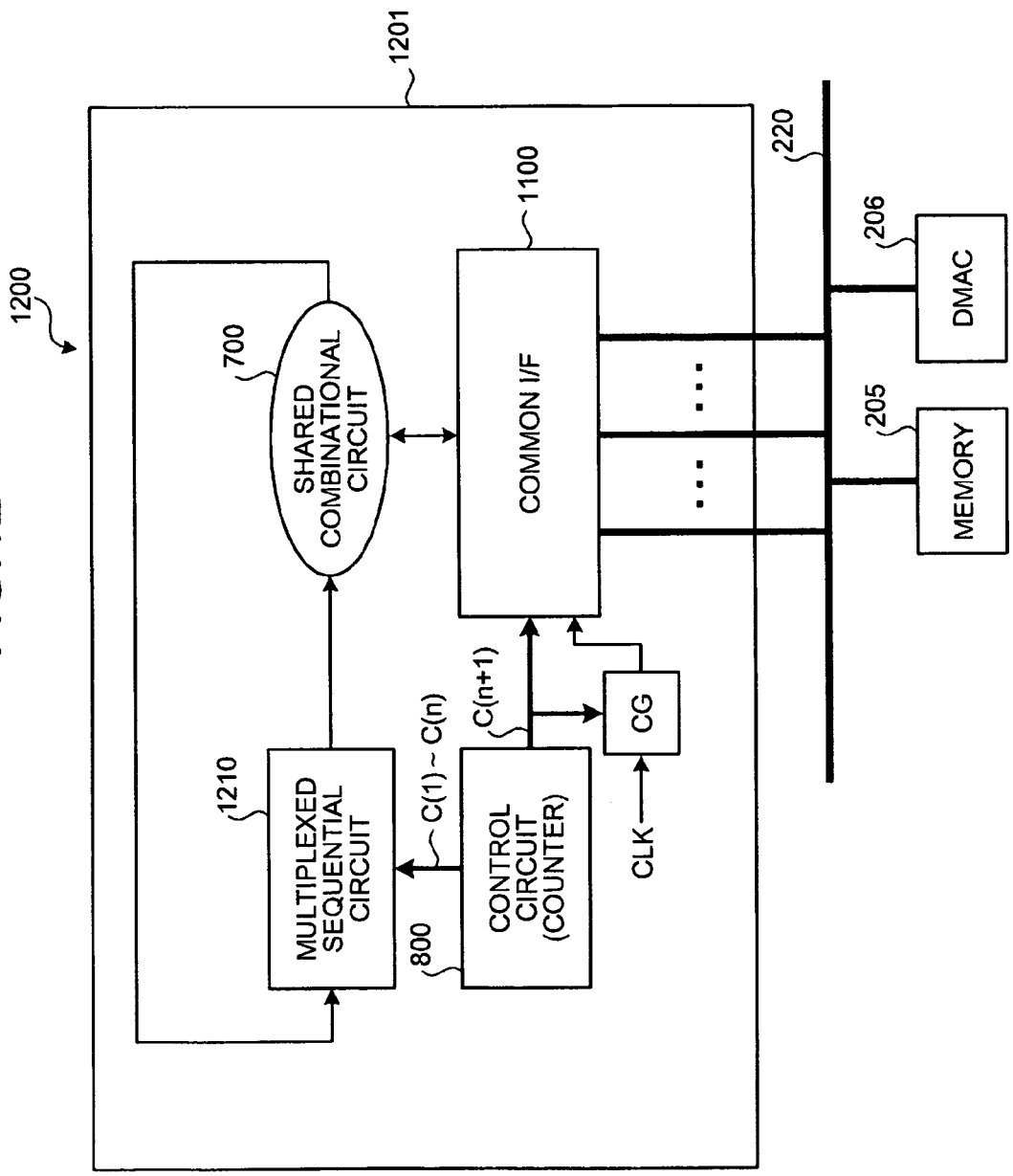
FIG. 12 is a schematic of a single module constructed by a constructing unit.

The constructing unit 605 constructs a single module by connecting the substitution modules 501 to 503, the shared combinational circuit 700, and the control circuit 800. FIG. 12 is a schematic of the single module constructed by the constructing unit 605.

A single module 1201 of FIG. 12 is a module that is substituted for the multiplexed module 201 composed of the CPUs 201-1 to 201-*n*. This means that the shared combinational circuit 700 is substituted for n combinational circuits 301-1 to 301-*n*, that a multiplexed sequential circuit 1210 composed of a multiplexed circuit (substitution module 501) group is substituted for n sequential circuits 302-1 to 302-*n*, and that the common I/F 1100 composed of a single input I/F (substitution module 502) and a single output I/F (substitution module 503) are substituted for n input pins 203-1 to 203-*n* and n output pins 204-1 to 204-*n*, respectively.

The control circuit 800 is connected to the multiplexed sequential circuit 1210 and the common I/F 1100. Of count signals C(1) to C(n+1) output from the control circuit 800, count signals C(1) to C(n) are output to the multiplexed sequential circuit 1210, and sequential circuit elements (FF and RAM) at each state (count value) i are time-division operated. The count signal C(n+1) is output to the common I/F 1100 for input/output operation in a state i+1.

The common I/F 1100 is provided with a clock CLK only when count value C(n+1) is output to a clock gate CG so that the common I/F 1100 operates for input/output only in the state i+1.

Thus, the circuit volume of a new system 1200 that is to be designed may become smaller after conversion than that before the conversion, and the circuit data volume may be drastically reduced by substituting the single module 1201 for the multiplexed module 201.

The output unit 606 of FIG. 6 outputs design data 600 of a construction result constructed by the constructing unit 605. Specifically, the design data 610 (netlist) of the new system 1200 that includes the post-conversion single module 1201 is output. The design data 610 may be output to the display 131 for screen display or the printer 132 for printing, may be written in the memory of the design data conversion apparatus 100, or may be transmitted to a simulator.

Figure 13:
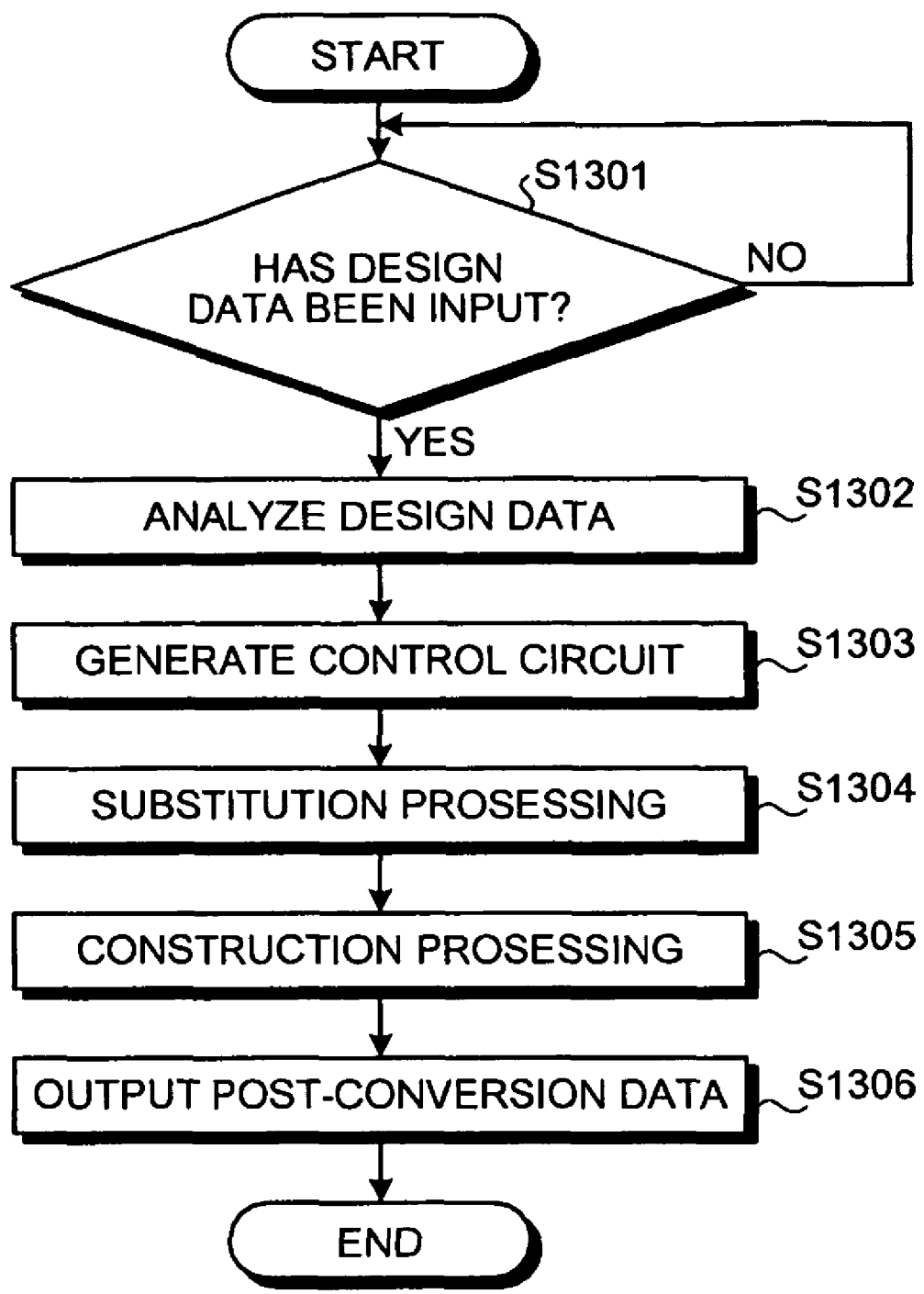
FIG. 13 is a flowchart of design data conversion processing of the design data conversion apparatus.

FIG. 13 is a flowchart of design data conversion processing of the design data conversion apparatus 100. The input unit 601 initially waits for the input of the design data 600 (netlist) of the system 200 (step S1301: NO), and when the design data 600 is input (step S1301: YES), the analyzing unit 602 analyzes the design data 600 (step S1302).

The generating unit 603 generates a control circuit 800 (step S1303) that counts up to n+1 cycles, where n is the number of CPUs of an identical category and type obtained by analysis. The substituting unit 604 substitutes the substitution modules 501 to 503 (step S1304). The constructing unit 605 constructs the post-conversion single module 1201 (step S1305). The design data 610 of the new system 1200 that includes the post-conversion single module 1201 is output (step S1306). Thus, a series of processing ends.

According to the first embodiment of the present invention, the CPUs 201-1 to 201-*n* are separated into the combinational circuits 301-1 to 301-*n* and the sequential circuits 302-1 to 302-*n*, and any sequential circuit 301-*i* among the sequential circuits 301-1 to 301-*n* is shared among all the CPUs 201-1 to 201-*n*.

In the case that operation of the system 200 is simulated, the control circuit 800 is generated and controls such that the internal operation of the CPU 201-*i* is simulated at the i-th clock CLK (i=1 to n) and operation of the common I/F 1100 is simulated by (n+1)-th clock CLK.

Thus, operation by one clock of the original system 200 is simulated by the (n+1)-th clock CLK. Although the post-conversion single module 1201 is n+1 times slower compared to the pre-conversion multiplexed module 201 of the system 200, the circuit scale thereof is smaller as the sequential circuits 301-1 to 301-*n* are shared.

Hence, there is an advantage in that simulation may be carried out for the system 200 with a scale beyond the capacity of a conventional simulator, a scale that was formerly impossible to be simulated. Thus, a designer may thoroughly verify operation of the original system 200 by providing a simulator with the design data 610 of the system 1200 that includes the single module 1201 having a reduced data volume.

While according to the first embodiment, the system 200 includes the multiplexed module 201 of a single category, the second embodiment describes a system to be designed that includes multiplexed modules of various categories. Hereinafter, only points differing from the first embodiment are described. The same reference numerals are given to components identical with those of the first embodiment and explanations thereof are omitted herein.

Figure 14:
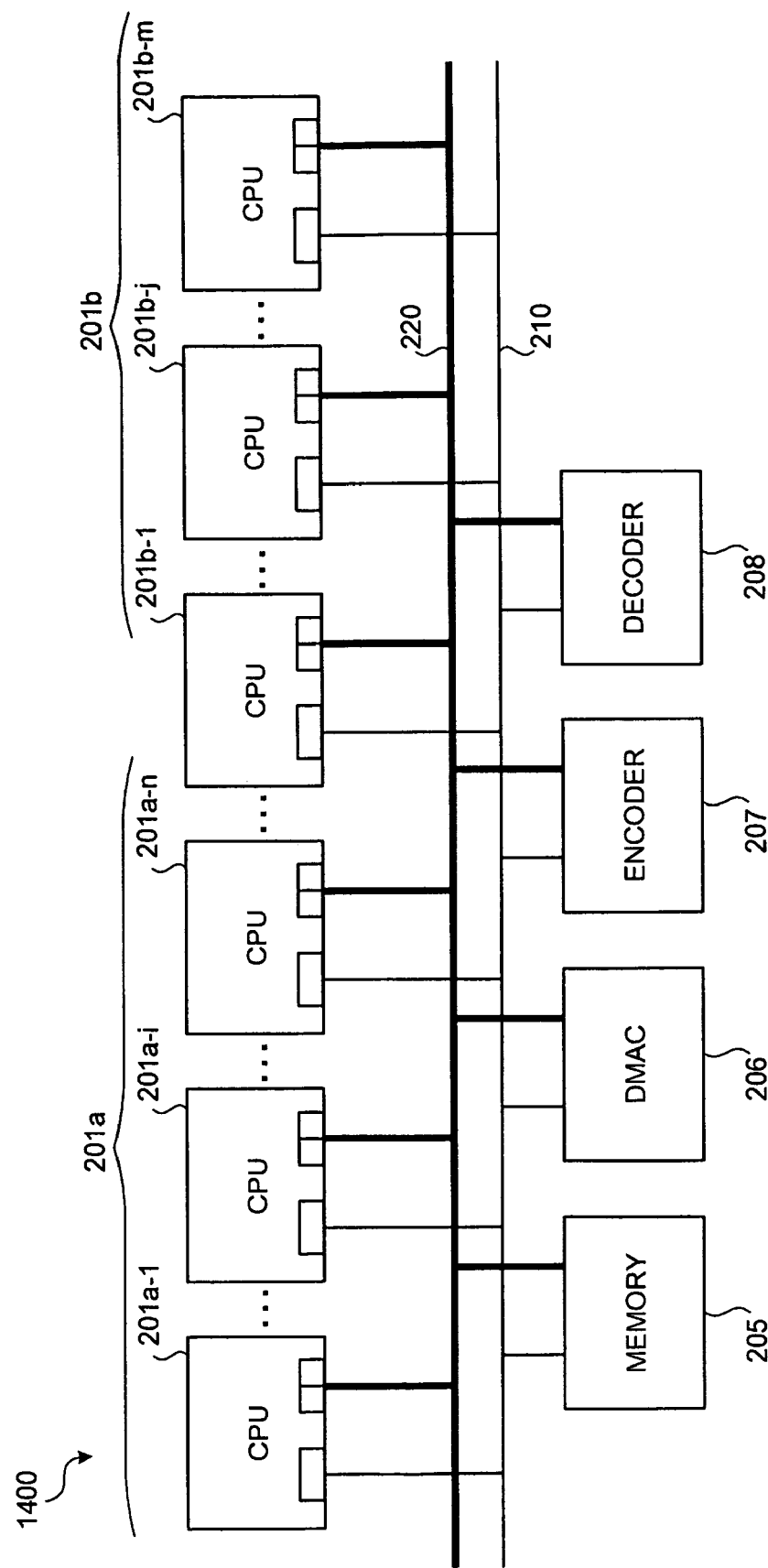
FIG. 14 is a schematic of an example of a system to be designed that includes plural multiplexed modules according to a second embodiment of the present invention.

FIG. 14 is a schematic of an example of a system to be designed that includes plural multiplexed modules according to the second embodiment of the present invention. As shown in FIG. 14, a system 1400 to be designed includes two multiplexed modules 201*a* and 201*b* of an identical category but of different types. Specifically, the multiplexed module 201*a* includes n CPUs 201*a*-1 to 201*a*-*n*, and the multiplexed module 201*b* includes m (n>m) CPUs 201*b*-1 to 201*b*-*m*.

Components of the multiplexed modules 201*a* and 201*b* are indicated by a and b, respectively, post-fixed to respective reference numerals. For example, an arbitrary CPU of the multiplexed module 201*a* is denoted as a CPU 201*a*-*i*.

In the system 1400, the analyzing unit 602 specifies the multiplexed module 201*a*, 201*b*, and the number of respective CPUs n and m. In this case, the generating unit 603 compares n and m and sets an upper limit count value of a counter, i.e., the control circuit 800, as n+1 based upon the assumption that n is greater than m.

Figure 15:
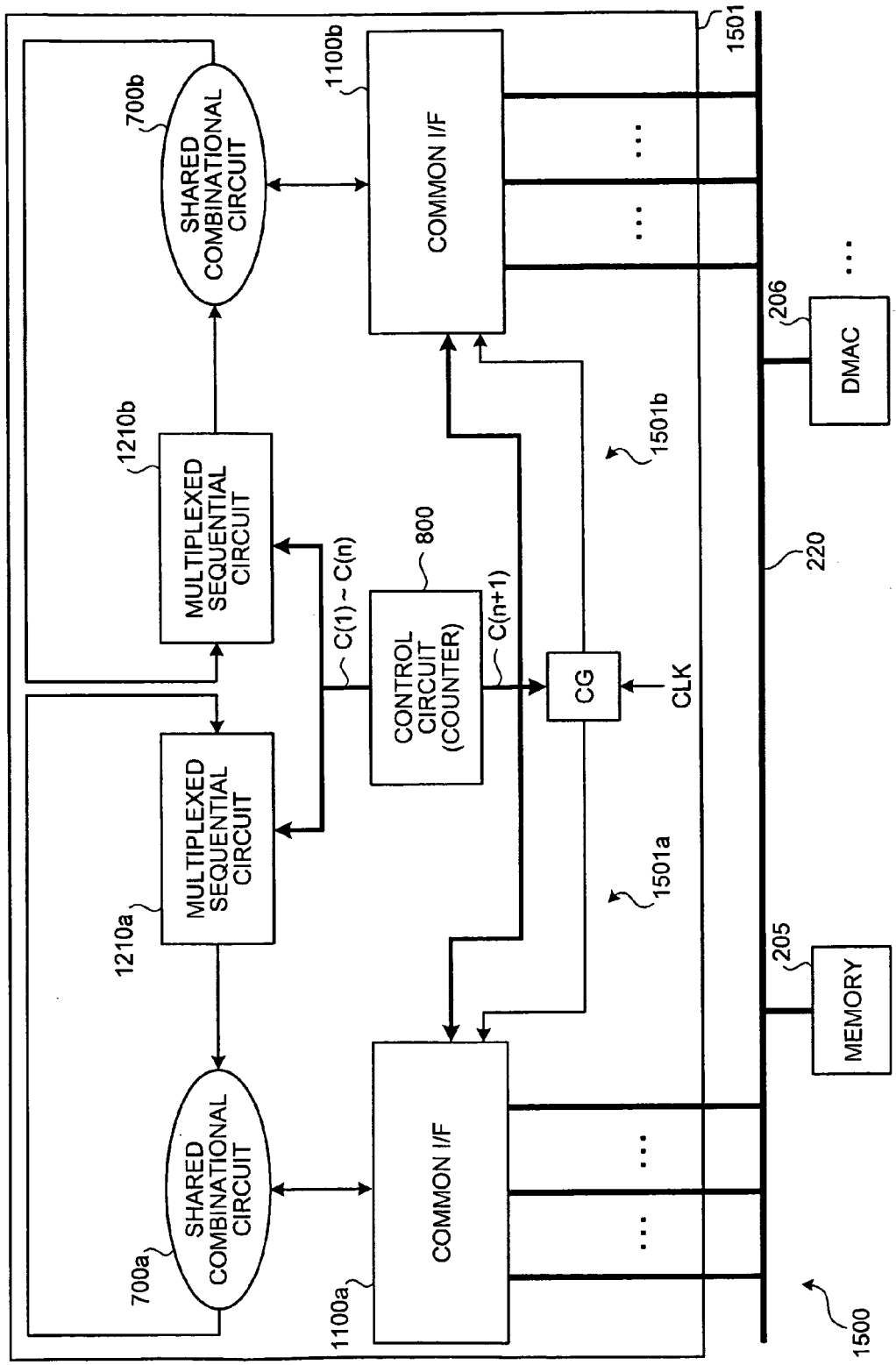
FIG. 15 is a schematic of a system constructed by the constructing unit according to the second embodiment.

FIG. 15 is a schematic of a system 1500 constructed by the constructing unit 605 according to the second embodiment. As shown in FIG. 15, the system 1500 includes a compound module 1501 composed of post-conversion single modules 1501a and 1501b, the control circuit 800, and a clock gate CG. The compound module 1501 replaces the original two multiplexed modules 201a and 201b.

The single module 1501a includes a shared combinational circuit 700a, a multiplexed sequential circuit 1210a, and a common I/F 1100a, and the single module 1501b includes a shared combinational circuit 700b, a multiplexed sequential circuit 1210b, and a common I/F 1100b. The control circuit 800 and the clock gate CG are common between the post-conversion single modules 1501a and 1501b.

In this case, the control circuit 800 counts from 1 to n+1, and count value is reset to one after n+1. Thus, the single module 1501a time-division operates the multiplexed sequential circuit 1210a for count values from 1 to n, and operates the common I/F 1100a at count value n+1.

On the other hand, the single module 1501b time-division operates the multiplexed sequential circuit 1210b for count values from 1 to m with no operation from m+1 to n. The common I/F 1100b is operated when count value reaches n+1.

Thus, when there are plural multiplexed modules, a reduction of both circuit data volume and simulation time are ensured by setting the upper limit count value of the control circuit 800 by using the number of CPUs of a multiplexed module having the largest number of CPUs. Although the case in which n>m is described in the second embodiment, a case n=m is also possible.

While the first embodiment described a case of a single system 200 including a multiplexed module, the third embodiment describes a multiplexed system to be designed that includes the system 200 in plural as system boards. Hereinafter, only points differing from either the first or the second embodiment are described. The same reference numerals are given to components identical with those of the first and second embodiment and explanation thereof is omitted herein.

Figure 16:
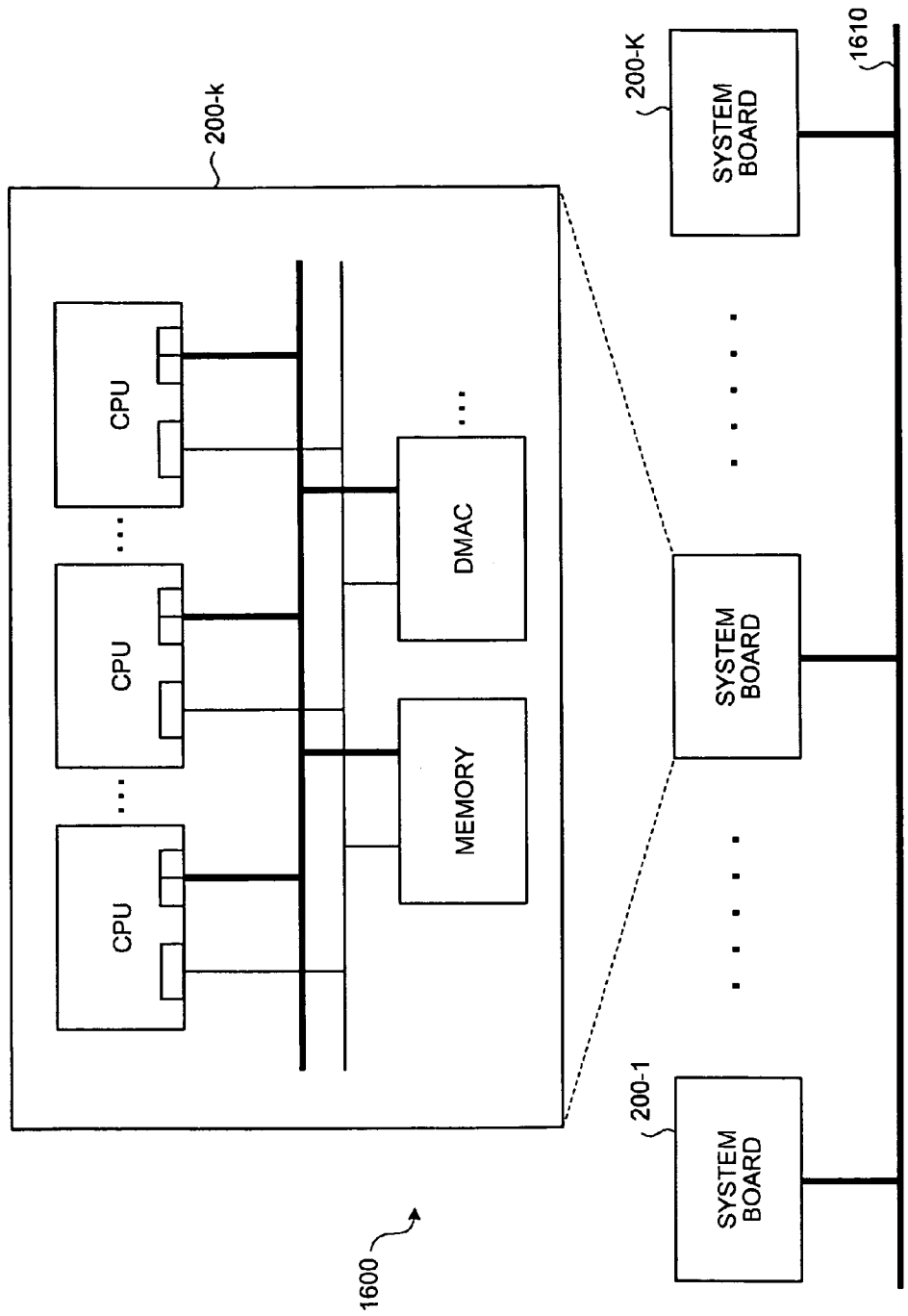
FIG. 16 is a schematic of a multiplexed system to be designed according to a third embodiment of the present invention.

FIG. 16 is a schematic of the multiplexed system to be designed according to the third embodiment of the present invention. As shown in FIG. 16, a multiplexed system 1600 that is to be designed is a system that includes the system 200 in plural as system boards. Specifically, the system 1600 has system boards 200-1 to 200-K connected to a bus 1610 for parallel operation.

Figure 17:
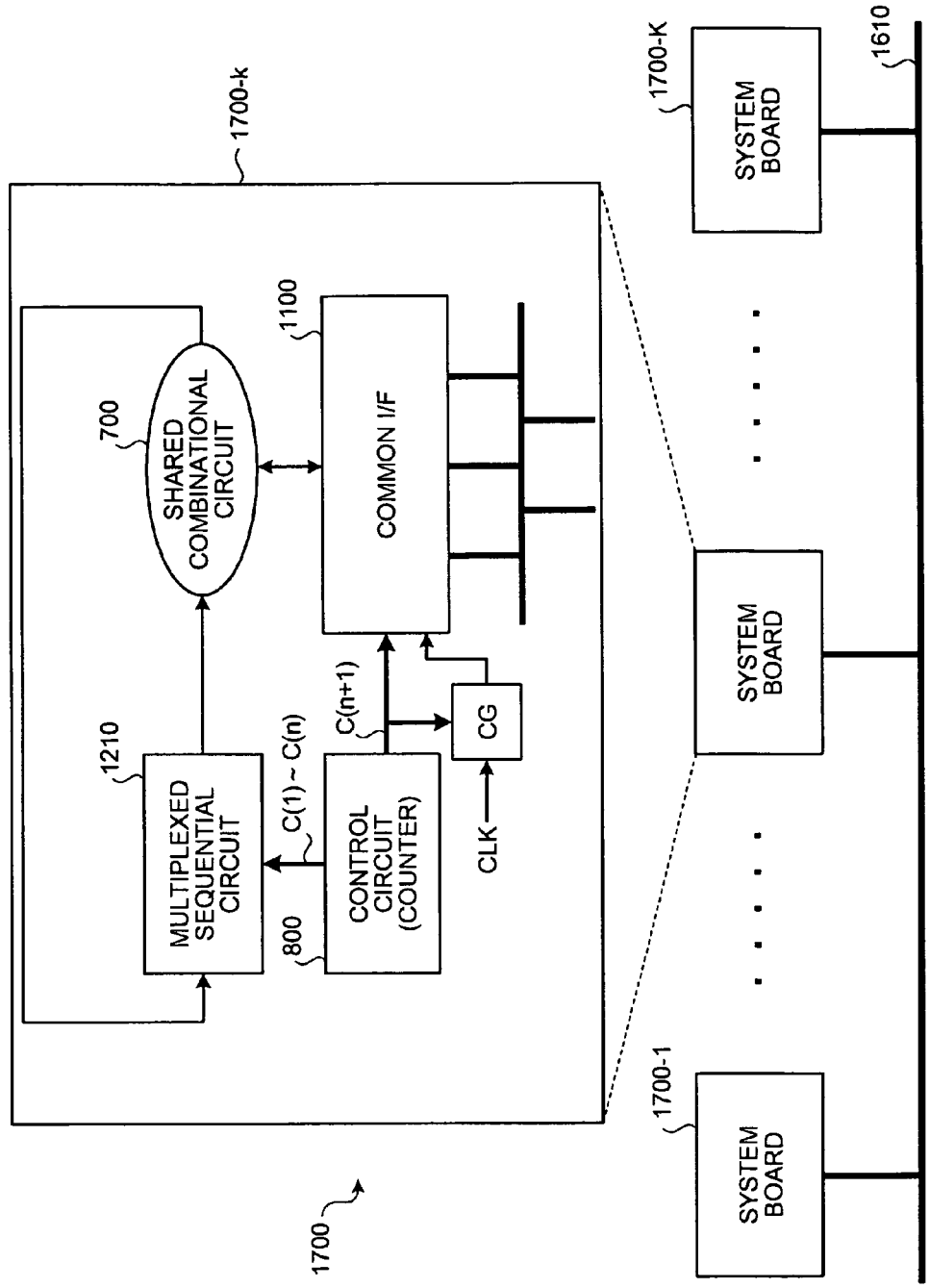
FIG. 17 is a schematic of the multiplexed system to be designed constructed by the constructing unit 605 according to the third embodiment of the present invention.

FIG. 17 is a schematic of the multiplexed system to be designed constructed by the constructing unit 605 according to the third embodiment of the present invention. System boards 1700-1 to 1700-K of a system 1700 that is to be designed, have a configuration identical to that of the post-construction system to be designed, system 1200 of FIG. 12. In the case that the design data 610 (netlist) of the system 1700 is simulated, as the number of CPUs of each system board 200-k is n and the number of the system boards is K as shown in FIG. 16, the count number is (n+1)×K.

Figure 18:
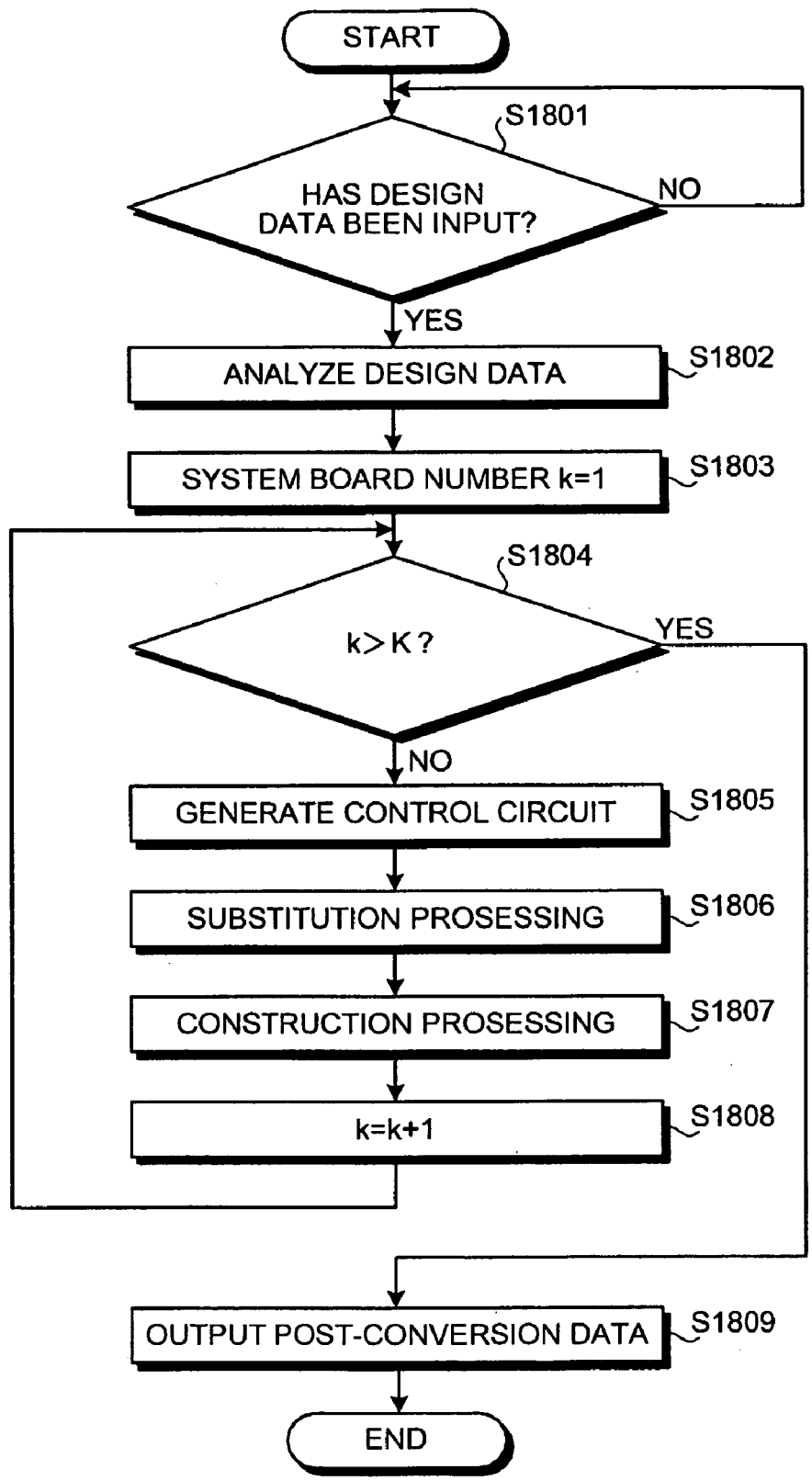
FIG. 18 is a flowchart of design data conversion processing according to the third embodiment.

FIG. 18 is a flowchart of design data conversion processing according to the third embodiment. The input unit 601 initially waits for input of the design data 600 (netlist) of the system 1600 of FIG. 16 (step S1801: NO), and when the design data 600 is input (step S1801: YES), the analyzing unit 602 analyzes the design data 600 (step S1802).

Index k of the number of system boards K analyzed is set k=1 (step S1803), and whether k>K is determined (step S1804). If k>K is not satisfied (step S1804: NO), the generation process of the control circuit 800 by the generating unit 603 (step S1805), the substitution process by the substituting unit 604 (step S1806), and the construction process by the constructing unit 605 (step S1807) are executed for a system board 200-k.

Then, the process returns to step S1804 incrementing k by one (step S1808). On the other hand, if k>K is satisfied (step S1804: YES), the output unit 606 outputs the design data 610 of the system 1700 of FIG. 17. Thus, a series of processing ends.

Hence, the third embodiment ensures reduction of circuit data volume by sequentially substituting a new system board 1700-k for each system board 200-k. Although the third embodiment defined the number of CPUs included in each system board 200-k as n, the number of CPUs may be uniquely defined for each system board 200-k.

By expanding the system 1600, conversion may be done as a single system to be designed including n×K CPUs and K input/output I/Fs. In this case, since count value set for the control circuit 800 becomes n×K+1 and is smaller than the count value (n+1)×K. Thus, the clock number may be reduced, shortening simulation time.

Comparing conversion methods with and without expansion, a conversion method may be selected based on the tradeoff between simulation speed and circuit data volume. According to the conversion method that expands the system 1600, K common I/Fs 1100 expanded from the system boards 200-1 to 200-K are shared, thereby a single common I/F 1100 is processed when count value is n×K+1.

Therefore, in the conversion method with expansion, compared to a conversion method without expansion, while the clock number is reduced and simulation time may be shortened, the circuit data volume of the single common I/F 1100 is not reduced as K common I/Fs 1100 are shared.

Further, in the case that conversion is performed without expansion of the system 1600, although clock number increases compared to conversion with expansion in which the count value becomes n×K+1, circuit data volume may be reduced as each common I/F 1100 is not shared. Thus, a designer may apply a method appropriate for a design object based on the tradeoff between the two conversion methods.

For example, in the case that simulation speed is of priority, a single system to be designed that includes a multiplexed module for parallel operation of n×K CPUs, is constructed by the conversion method with expansion of the system 1600 and compiled. If the compilation result can be fully mounted on the FPGA, high speed simulation can be realized by simulation under such conditions.

On the other hand, if the result cannot be fully mounted on the FPGA, the post-conversion system 1700 is constructed by conversion without expansion of the system 1600, and as the circuit data volume is reduced, the compiled result can be mounted on the FPGA, and the simulation executed.

The third embodiment ensures reduction of circuit scale of a system to be designed, allowing simulation by an FPGA and thereby reducing the simulation time.

Since a multiplexed module with a large circuit scale and a single module with small circuit scale are equivalent, conventional pseudo-processors are not required, thereby reducing the design load on a designer and ensuring high speed simulation without omission.

Thus, according to the third embodiment, for a system that includes a multiplexed module, improved simulation accuracy and a shortened design term are ensured.

The method explained in the present embodiments can be implemented by a computer, such as a personal computer and a workstation, executing a program that is prepared in advance. The program is recorded on a computer-readable recording medium such as a hard disk, a flexible disk, a CD-ROM, an MO, and a DVD, and is executed by being read out from the recording medium by a computer. The program can be a transmission medium that can be distributed through a network such as the Internet.

As explained above, the multiplexed module formed by plural modules can be converted into a single module that is equivalent thereto and has less circuit data, and input and output pins included in each of the modules can be consolidated into a single input I/F and output I/F, thereby enabling a reduction of the circuit data. Further, for a design subject formed by plural systems that include plural multiplexed modules, the multiplexed modules within each system can be converted into a single module that is equivalent thereto and has less circuit data. In the event of simulation, the simulation can be performed under time-division operation based on the greatest module count among the multiplexed modules, thereby enabling a reduction in the time required for simulation.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A computer-readable recording medium storing therein a design data conversion computer program that causes a computer to execute:
   receiving, by the computer, design data of a design subject, the design subject being a system that includes a multiplexed module formed of a plurality of modules of an identical category and type that operate in parallel and each include a combinational circuit and a sequential circuit;
   substituting, by the computer, the sequential circuits of the modules with a multiplexed element formed by multiplexing a group of sequential circuit elements common to each of the sequential circuits;
   generating, by the computer, a control circuit that time-division operates the multiplexed element;
   constructing, by the computer, based on the design data, a single module that includes one combinational circuit selected from among the combinational circuits of the modules, the multiplexed element, and the control circuit; and
   outputting, by the computer, design data of the system including the single module.

2. The computer-readable recording medium according to claim 1, wherein the design data conversion computer program further causes the computer to execute:
   substituting a group of input pins respectively disposed in the modules with an input interface that selectively inputs, to the one combinational circuit, input to the modules; and
   substituting a group of output pins respectively disposed in the modules with an output interface that selectively outputs output from the one combinational circuit to the modules, wherein
   the single module further includes the input interface and the output interface, and
   the control circuit further time-division operates the input interface and the output interface.

3. The computer-readable recording medium according to claim 1, wherein
   when the design subject is a multiplexed system formed of a plurality of the systems operating in parallel, the substituting, the generating, the constructing, and the outputting are performed for each of the systems forming the multiplexed system.

4. A design data conversion apparatus comprising:
   a input unit that receives design data of a design subject, the design subject being a system that includes a multiplexed module formed of a plurality of modules of an identical category and type that operate in parallel and each include a combinational circuit and a sequential circuit;
   a substituting unit that substitutes the sequential circuits of the modules with a multiplexed element formed by multiplexing a group of sequential circuit elements common to each of the sequential circuits;
   a generating unit that generates a control circuit that time-division operates the multiplexed element;
   a constructing unit that constructs, based on the design data, a single module that includes one combinational circuit selected from among the combinational circuits of the modules, the multiplexed element, and the control circuit; and
   an output unit that outputs design data of the system including the single module.

\* \* \* \* \*